United States Patent
Kikkawa et al.

(10) Patent No.: US 8,294,181 B2
(45) Date of Patent: Oct. 23, 2012

(54) COMPOUND SEMICONDUCTOR DEVICE AND METHOD OF MANUFACTURING THE SAME

(75) Inventors: Toshihide Kikkawa, Kawasaki (JP); Kenji Imanishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 152 days.

(21) Appl. No.: 12/697,391

(22) Filed: Feb. 1, 2010

(65) Prior Publication Data

US 2011/0031532 A1 Feb. 10, 2011

(30) Foreign Application Priority Data

Feb. 4, 2009 (JP) ................ 2009-023953

(51) Int. Cl.
*H01L 29/66* (2006.01)
(52) U.S. Cl. ............... 257/194; 257/471; 257/E29.248; 257/E29.251; 257/E21.407
(58) Field of Classification Search .......... 257/12, 257/192, 194, 471, E29.246, E29.248, E29.252, 257/E29.251, E29.25, E21.403, E21.407
See application file for complete search history.

(56) References Cited

U.S. PATENT DOCUMENTS

| 7,638,819 | B2 | 12/2009 | Kikkawa et al. |
| 7,859,014 | B2 | 12/2010 | Nakayama et al. |
| 7,902,571 | B2 * | 3/2011 | Isono et al. ............... 257/192 |
| 2003/0201459 | A1 | 10/2003 | Sheppard et al. |
| 2007/0029640 | A1 | 2/2007 | Isono et al. |
| 2008/0197359 | A1 | 8/2008 | Imanishi et al. |
| 2008/0237610 | A1 | 10/2008 | Imanishi et al. |
| 2009/0045438 | A1 * | 2/2009 | Inoue et al. ................... 257/192 |

FOREIGN PATENT DOCUMENTS

| EP | 1657754 A2 | 5/2006 |
| EP | 1978550 | 10/2008 |
| JP | 2003-309071 A | 10/2003 |
| JP | 2006-114653 A | 4/2006 |
| JP | 2006-147663 A | 6/2006 |
| JP | 2008-205146 A | 9/2008 |
| JP | 2008-251966 A | 10/2008 |

OTHER PUBLICATIONS

Chinese Office Action, English-language Translation mailed May 18, 2011 for corresponding Chinese Application No. 201010111011.9.
"Extended European Search Report" mailed by EPO and corresponding to European application No. 10152567.3 on May 16, 2011.
Chinese Office Action mailed Jan. 4, 2012 for corresponding Chinese Application No. 201010111011.9, with English-language Translation.

* cited by examiner

*Primary Examiner* — Eduardo A Rodela
(74) *Attorney, Agent, or Firm* — Fujitsu Patent Center

(57) ABSTRACT

A compound semiconductor device is provided with a substrate, an AlN layer formed over the substrate, an AlGaN layer formed over the AlN layer and larger in electron affinity than the AlN layer, another AlGaN layer formed over the AlGaN layer and smaller in electron affinity than the AlGaN layer. Furthermore, there are provided an i-GaN layer formed over the latter AlGaN layer, and an i-AlGaN layer and an n-AlGaN layer formed over the i-GaN layer.

12 Claims, 13 Drawing Sheets

COMPOUND SEMICONDUCTOR DEVICE
AND METHOD OF MANUFACTURING THE
SAME

CROSS-REFERENCE TO RELATED
APPLICATIONS

This application is based upon and claims the benefit of priority of the prior Japanese Patent Application No. 2009-023953, filed on Feb. 4, 2009, the entire contents of which are incorporated herein by reference.

FIELD

The embodiments discussed herein are directed to a compound semiconductor device and a method of manufacturing the same.

BACKGROUND

In late years, there are eagerly developed electronic devices (compound semiconductor devices) in which a GaN layer and an AlGaN layer are formed sequentially on a substrate made of sapphire, SiC, GaN, Si, or the like, and the GaN layer is used as a channel layer. GaN has a band gap of 3.4 eV, which is larger compared to 1.4 eV of GaAs. Accordingly, the compound semiconductor device is expected to operate with a high breakdown voltage.

Amplifiers for base station of mobile phones are required to operate at high voltage for improving current efficiency, and thus improvement in breakdown voltage is needed. Currently, there has been reported a value higher than 300 V as a breakdown voltage when current is off in a GaN-based high electron mobility transistor (HEMT), which is used in the amplifiers for base station. Further, there has been reported a value higher than 200 V as a breakdown voltage when current is off also in an HEMT used in an extremely high frequency band.

FIG. 1 is a cross-sectional view illustrating a structure of a conventional GaN-based HEMT. On an SiC substrate 101, there are sequentially formed an AlN layer 102, a non-doped i-GaN layer 105, a non-doped i-AlGaN layer 106, an n-type n-AlGaN layer 107, and an n-type n-GaN layer 108. Moreover, an SiN layer 109 is formed on the n-GaN layer 108. An opening is formed in the SiN layer 109, and a gate electrode 111g is formed therein. In the n-GaN layer 108 and the SiN layer 109, two openings are further formed with the gate electrode 111g being interposed therebetween. A source electrode 111s is formed in one of the openings, and a drain electrode 111d is formed in the other. Incidentally, the AlN layer 102 functions as a buffer layer. The gate electrode 111g is in Schottky contact with the n-GaN layer 108, and the source electrode 111s and the drain electrode 111d are in ohmic contact with the n-AlGaN layer 107.

When such a conventional GaN-based HEMT is used as an electronic device with a high breakdown voltage, its characteristics may vary largely. For example, when turning on/off a high frequency power operation is repeated, the output thereof may drift. This phenomenon will be described.

FIG. 2 is a circuit diagram illustrating a structure of a circuit having the GaN-based HEMT. In the circuit, a source of the transistor (GaN-based HEMT) Tr is grounded, and to a drain thereof, one end of an inductor L and one end of a resistor R are connected. A direct current (DC) bias Vd is applied to the other end of the inductor L. Further, the other end of the resistor R is grounded. To a gate of the transistor Tr, an alternating current (AC) power supply P is connected, which applies an AC signal RF of −2 V to 4 V. Incidentally, to the gate of the transistor Tr, a gate voltage Vg of −1 V is applied during an off time, in which the AC signal RF is not applied.

When such a circuit is used for an amplifier for base station, the DC bias Vd is set to about 50 V, and the average value of drain current is set to about 2% to 3% of a maximum value. When a high-frequency signal (AC signal RF) of about 2 GHz is applied to the gate of the transistor Tr, a current-voltage characteristic as illustrated in FIG. 3 is obtained. The horizontal axis in FIG. 3 is a drain (drain-source) voltage, and the vertical axis is a drain (drain-source) current.

Further, in an amplifier for base station, on/off of the transistor Tr is switched frequently. For example, control as illustrated in FIG. 4A is performed. The vertical axis in FIG. 4A is a value of DC drain current at a bias point. The quiescent current value of 10 mA/mm is a current value set in advance, which flows when the high-frequency signal is off, and the average value of 150 mA/mm is the average value of the drain current when the high-frequency signal is on.

However, when it is attempted to perform control as illustrated in FIG. 4A, the current drops excessively in practice when the high-frequency signal is turned off, as illustrated in FIG. 4B, and a sufficient output (current of 150 mA/mm) cannot be obtained when the high-frequency signal is turned on thereafter. That is, a drift phenomenon of output occurs. Due to such an excessive drop, the current may become about 1 mA/mm to 2 mA/mm. The drop of current recovers over time, but a long time period of one or more minutes is needed for recovering to a degree that the output becomes stable. Therefore, a time period of one or more minutes is needed for the DC bias to recover to the original state, which may hinder intermittent on/off operation of the high-frequency signal. Such an excessive response characteristic exists in the conventional GaN-based HEMT illustrated in FIG. 1.

A technique to suppress the drift phenomenon of output accompanying such an excessive response characteristic is discussed in Japanese Laid-open Patent Publication No. 2006-147663. FIG. 5 is a cross-sectional view illustrating a structure of a conventional GaN-based HEMT discussed in Japanese Laid-open Patent Publication No. 2006-147663.

In the GaN-based HEMT, an AlGaN layer 103 is provided between the AlN layer 102 and the i-GaN layer 105 of the GaN-based HEMT illustrated in FIG. 1.

In such a GaN-based HEMT illustrated in FIG. 5, crystallinity of the i-GaN layer 105 improves as compared to the GaN-based HEMT illustrated in FIG. 1. Accordingly, two-dimensional electron gas captured in a trap existing in a lower portion of the i-GaN layer 105 can be emitted easily, and the drift phenomenon of output accompanying the excessive response characteristic is suppressed. FIG. 6 is a graph illustrating drift phenomena of output of the GaN-based HEMT illustrated in FIG. 1 and the GaN-based HEMT illustrated in FIG. 5. The solid line in FIG. 6 depicts the characteristic of the GaN-based HEMT illustrated in FIG. 1, and the chain and dot line depicts the characteristic of the GaN-based HEMT illustrated in FIG. 5. When the quiescent current value of the drain current during an off-time of application of the high-frequency signal is 10 mA/mm, a recovery of the drain current to about 9 mA/mm allows to obtain sufficient output upon application of the next high-frequency signal. Then as illustrated in FIG. 6, even if the drain current decreases to about 2 mA/mm during an off time of application of the high-frequency signal, the drain current recovers to about 9 mA/mm by about four seconds.

Further, a technique to suppress the drift phenomenon of output is discussed also in Japanese Laid-open Patent Publication No. 2008-251966. In the technique, the surface of the AlN layer corresponding to the AlN layer 102 of the GaN-based HEMT illustrated in FIG. 1 is made coarse.

By the techniques discussed in Japanese Laid-open Patent Publication No. 2006-147663 and Japanese Laid-open Patent Publication No. 2008-251966, the initial objects can be achieved. However, for realizing quicker operations, it is necessary to recover the dropped drain current more quickly.

Patent Document 1: Japanese Laid-open Patent Publication No. 2006-114653

Patent Document 2: Japanese Laid-open Patent Publication No. 2006-147663

Patent Document 3: Japanese Laid-open Patent Publication No. 2008-251966

Patent Document 4: Japanese Laid-open Patent Publication No. 2008-205146

SUMMARY

According to a first aspect of the embodiment, a compound semiconductor device is provided with a substrate, a first buffer layer formed over the substrate, a second buffer layer formed over the first buffer layer and larger in electron affinity than the first buffer layer, and a third buffer layer formed over the second buffer layer and smaller in electron affinity than the second buffer layer. Furthermore, the compound semiconductor device is provided with a channel layer formed over the third buffer layer, and an electron supply layer formed over the channel layer.

According to a second aspect of the embodiment, a compound semiconductor device is provided with a substrate, a first buffer layer formed over the substrate and containing aluminum, a second buffer layer formed over the first buffer layer and containing a lower concentration of aluminum than that in the first buffer layer, and a third buffer layer formed over the second buffer layer and containing a higher concentration of aluminum than that in the second buffer layer. Furthermore, the compound semiconductor device is provided with a channel layer formed over the third buffer layer, and an electron supply layer formed over the channel layer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, embodiments will be explained specifically with reference to accompanying drawings.

First Embodiment

Figure 7:
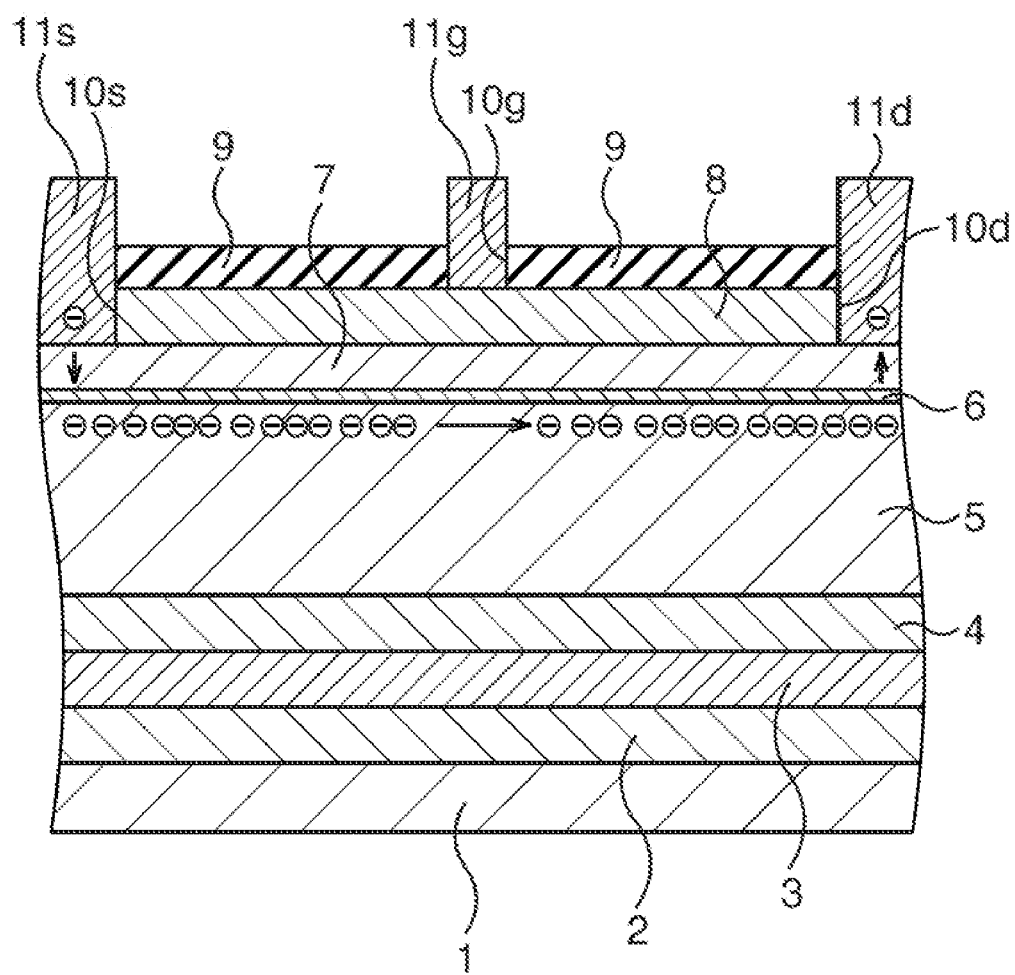
FIG. 7 is a cross-sectional view illustrating a structure of a GaN-based HEMT (compound semiconductor device) according to a first embodiment.

First, a first embodiment will be described. FIG. 7 is a cross-sectional view illustrating a structure of a GaN-based HEMT (compound semiconductor device) according to the first embodiment.

In the first embodiment, on a substrate 1 such as an SiC substrate, an AlN layer 2 having a thickness of about 5 nm to 300 nm (200 nm for example) is formed. On the AlN layer 2, an AlGaN layer 3 having a thickness of about 10 nm to 300 nm (200 nm for example) is formed, and an AlGaN layer 4 having a thickness of about 2 nm to 100 nm (10 nm for example) is formed on the AlGaN layer 3. The AlGaN layer 3 has a composition represented by $Al_{x1}Ga_{1-x1}N$, and the AlGaN layer 4 has a composition represented by $Al_{x2}Ga_{1-x2}N$. The electron affinity of the AlGaN layer 3 is higher than electron affinities of the AlN layer 2 and the AlGaN layer 4, and the electron affinity of the AlN layer 2 is lower than the electron affinity of the AlGaN layer 4. The value of x1 is smaller than the value of x2. The value of x1 is about 0.1 to 0.5 (0.4 for example), and the value of x2 is about 0.3 to 1 (0.8 for example). Further, on the AlGaN layer 4, a non-doped i-GaN layer 5 having a thickness of about 200 nm to 3000 nm (800 nm for example) is formed. A non-doped i-AlGaN layer 6 having a thickness of about 0 nm to 10 nm (2 nm for example) is formed on the i-GaN layer 5, and an n-type n-AlGaN layer 7 having a thickness of about 5 nm to 50 nm (20 nm for example) is formed on the i-AlGaN layer 6. The i-AlGaN layer 6 and the n-AlGaN layer 7 have a composition represented by $Al_{x3}Ga_{1-x3}N$, and the value of x3 is about 0.1 to 0.4 (0.2 for example). Furthermore, an n-type n-GaN layer 8 having a thickness of about 1 nm to 15 nm (6 nm for example) is formed on the n-AlGaN layer 7, and an SiN layer 9 having a thickness of about 10 nm to 700 nm (40 nm for example) is formed on the n-GaN layer 8. The n-AlGaN layer 7 is doped with Si from about $1\times10^{15}$ cm$^{-3}$ to about $5\times10^{18}$ cm$^{-3}$ ($1\times10^{18}$ cm$^{-3}$ for example). The n-GaN layer 8 is doped with Si from about $1\times10^{15}$ cm$^3$ to about $1\times10^{19}$ cm$^{-3}$ ($5\times10$ cm$^{-3}$ for example).

In the SiN layer 9, an opening 10g for gate electrode is formed. Further, in the SiN layer 9 and the n-GaN layer 8, an opening 10s for source electrode and an opening 10d for drain electrode are formed with the opening 10g being interposed therebetween. A gate electrode 11g is formed in the opening 10g, a source electrode 11s is formed in the opening 10s, and a drain electrode 11d is formed in the opening 10d. The gate electrode 11g is made up of, for example, an Ni film and Au film formed thereon. Further, the source electrode 11s and the drain electrode 11d are made up of, for example, a Ta film and an Al film formed thereon. The gate electrode 11g is in Schottky contact with the n-GaN layer 8, and the source electrode 11s and the drain electrode 11d are in ohmic contact with the n-AlGaN layer 7.

Figure 8:
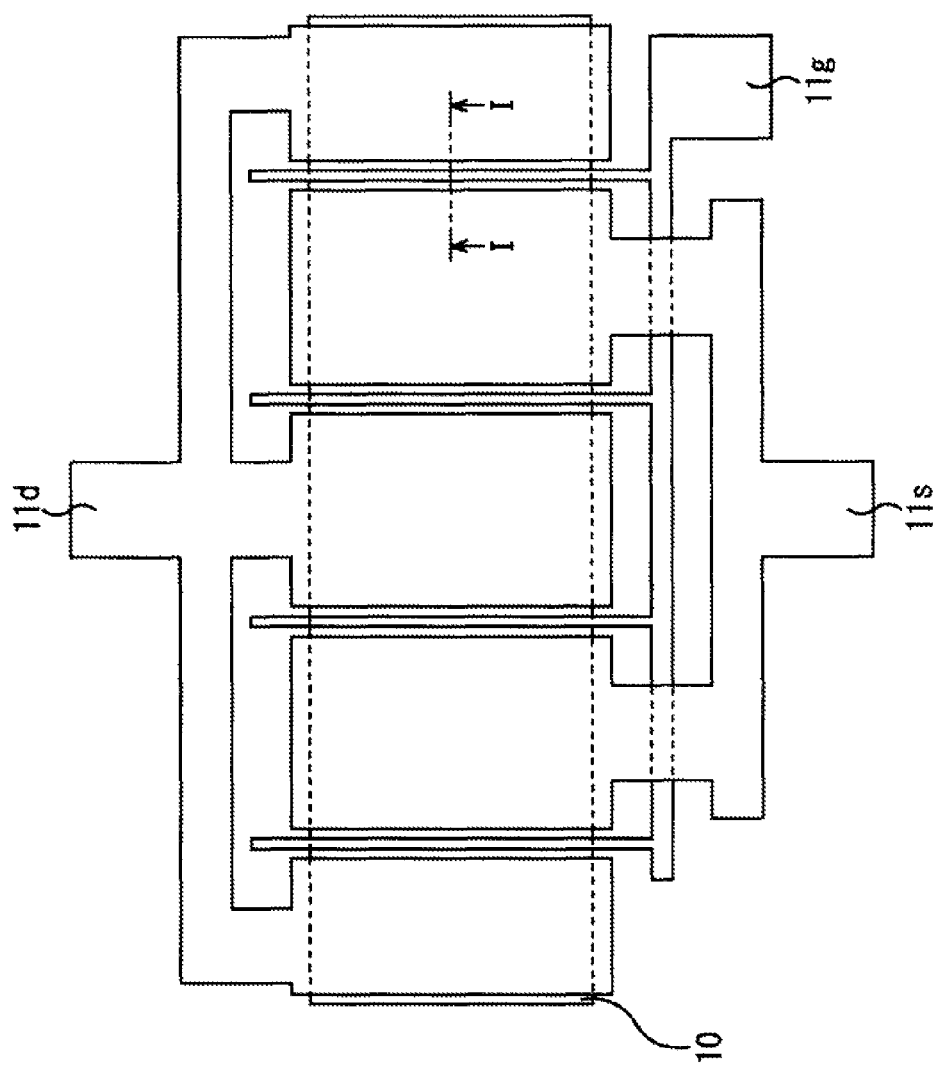
FIG. 8 is a layout view illustrating the structure of the GaN-based HEMT according to the first embodiment.

Incidentally, a layout seen from a surface side of the substrate 1 is, for example, as illustrated in FIG. 8. That is, the gate electrode 11g, the source electrode 11s and the drain electrode 11d have a comb-like planar shape, in which the source electrode 11s and the drain electrode 11d are arranged alternately. The gate electrode 11g is arranged between therebetween. By adopting such a multi-finger gate structure, the output can be improved. Note that the cross-section illustrated in FIG. 7 is taken along a line I-I in FIG. 8. Further, in an active region 10, the AlN layer 2, the AlGaN layer 3, the AlGaN layer 4 and the i-GaN layer 5, and so on are included, and the surrounding of the active region 10 is made as a non-active region by ion-implantation, mesa etching, or the like.

In the first embodiment as described above, a piezoelectric effect due to lattice mismatch induces electrons in the vicinity of the interface of the i-GaN layer 5 with the i-AlGaN layer 6. As a result, two-dimensional electron gas layer (2DEG) appears, and this portion functions as a channel layer. Further, the i-AlGaN layer 6 and the n-AlGaN layer 7 function as an electron supply layer.

The AlN layer 2, the AlGaN layer 3 and the AlGaN layer 4 function as a buffer layer. By the combination of these buffer layers, it becomes difficult for electrons induced in a surface layer portion of the i-GaN layer 5 to reach the trap existing in a lower portion of the i-GaN layer 5.

Figure 1:
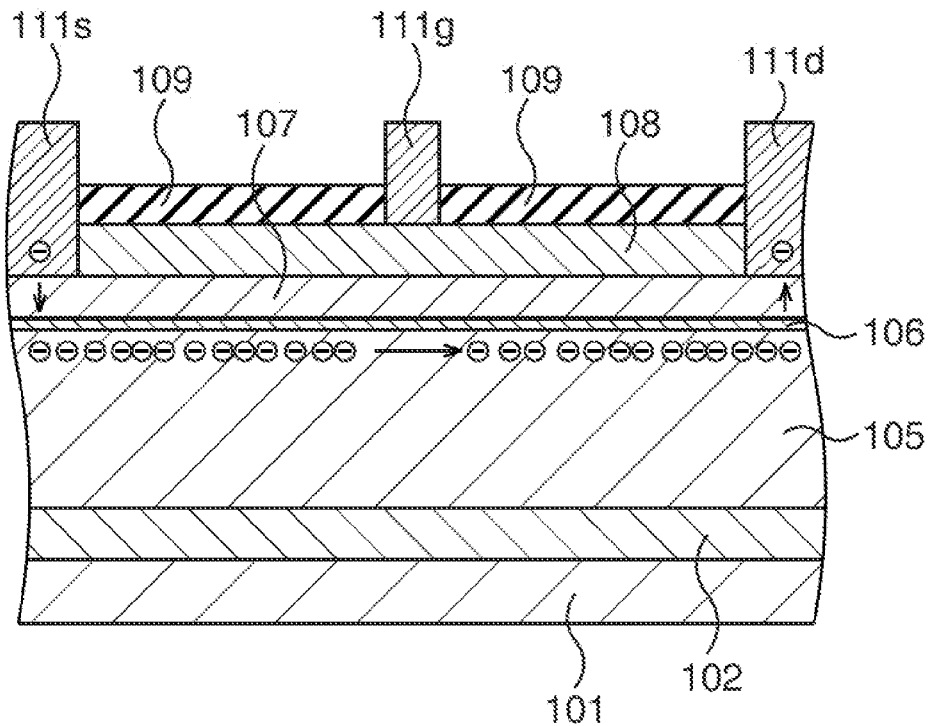
FIG. 1 is a cross-sectional view illustrating a structure of a conventional GaN-based HEMT.
Figure 2:
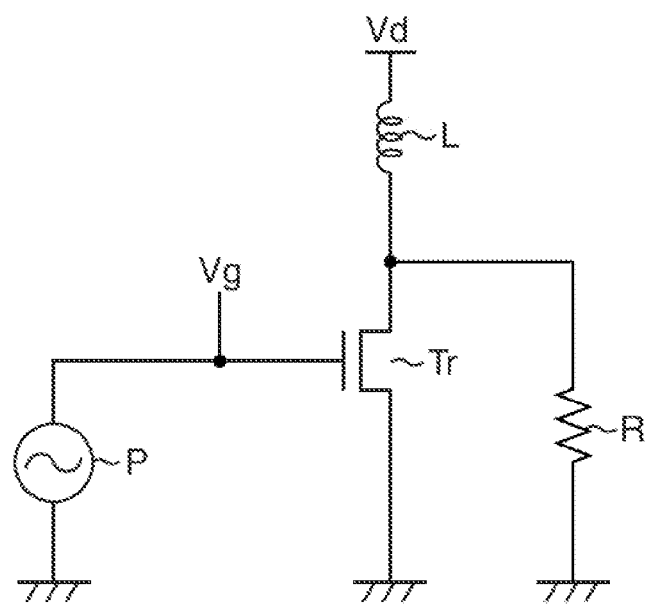
FIG. 2 is a circuit diagram illustrating a structure of a circuit having a GaN-based HEMT.
Figure 3:
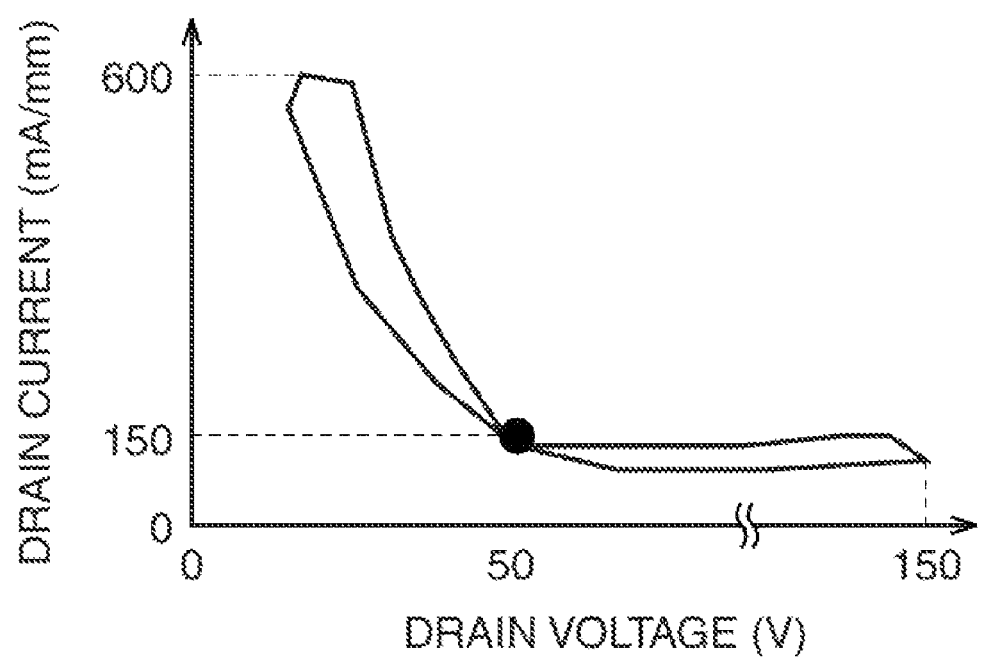
FIG. 3 is a chart illustrating a current-voltage characteristic of a conventional GaN-based HEMT.
Figure 4A:
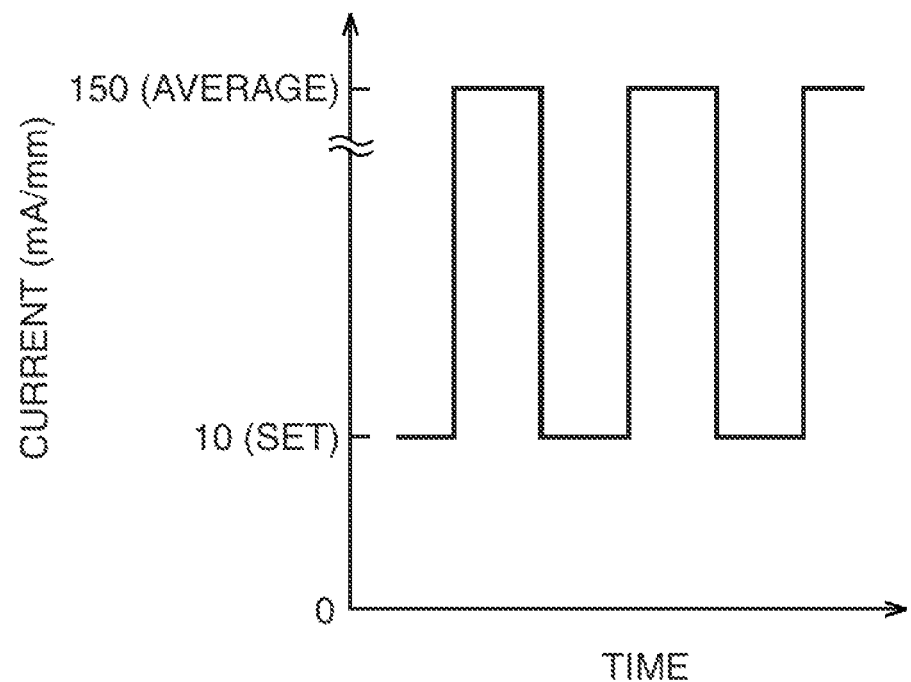
FIGS. 4A and 4B are charts illustrating a method of controlling a transistor Tr.
Figure 4B:
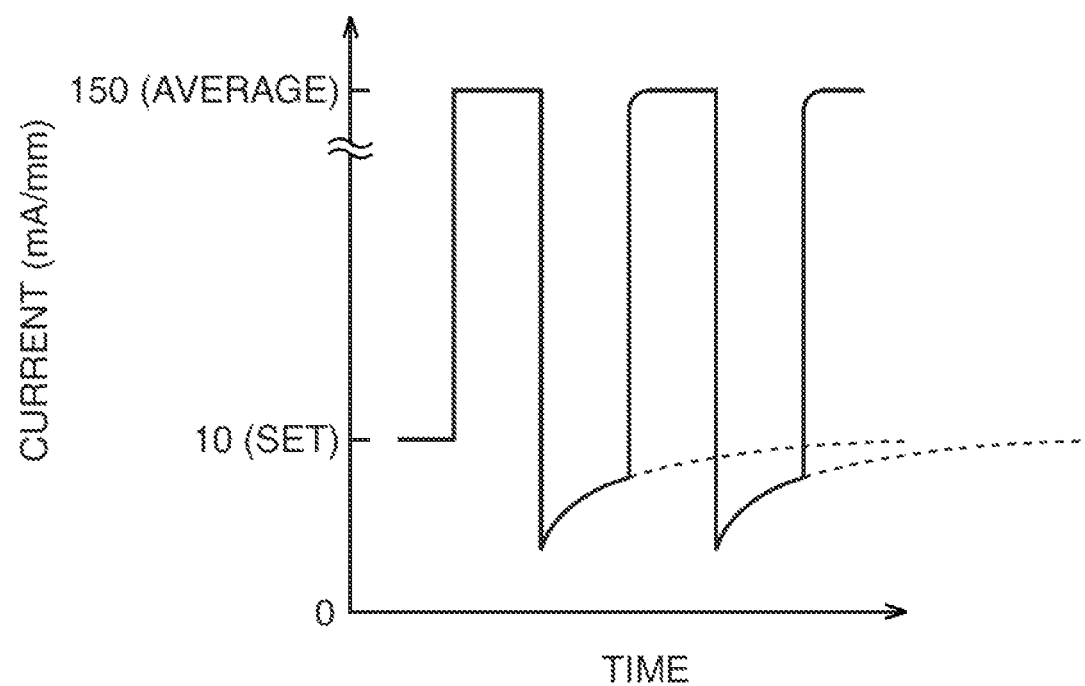
Figure 5:
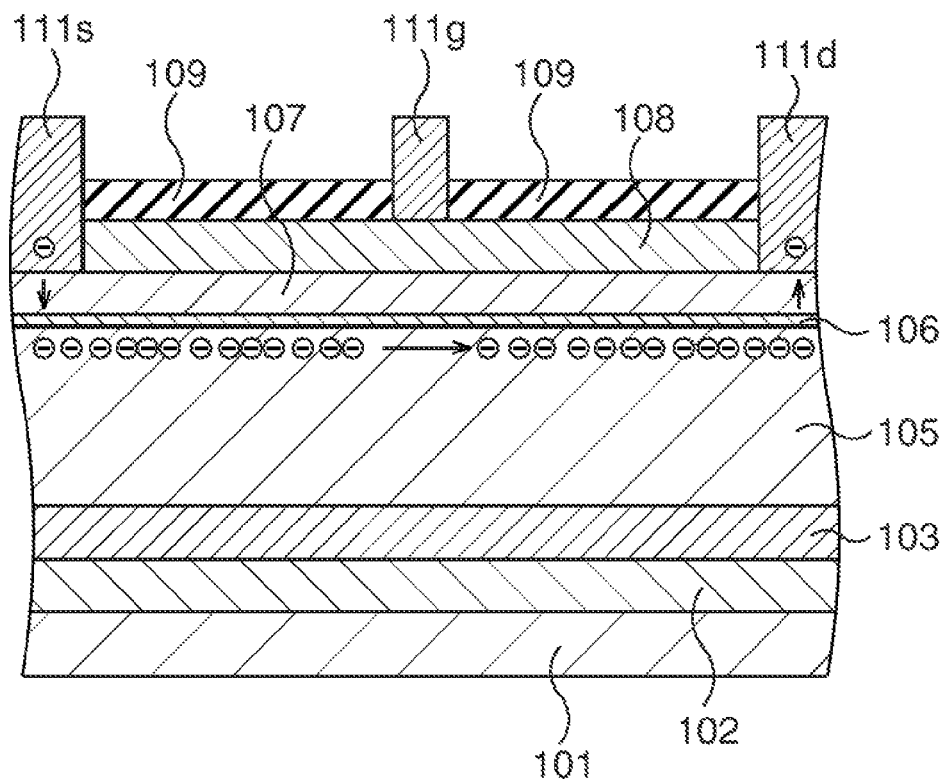
FIG. 5 is a cross-sectional view illustrating a structure of a conventional GaN-based HEMT discussed in Japanese Laid-open Patent Publication No. 2006-147663.
Figure 6:
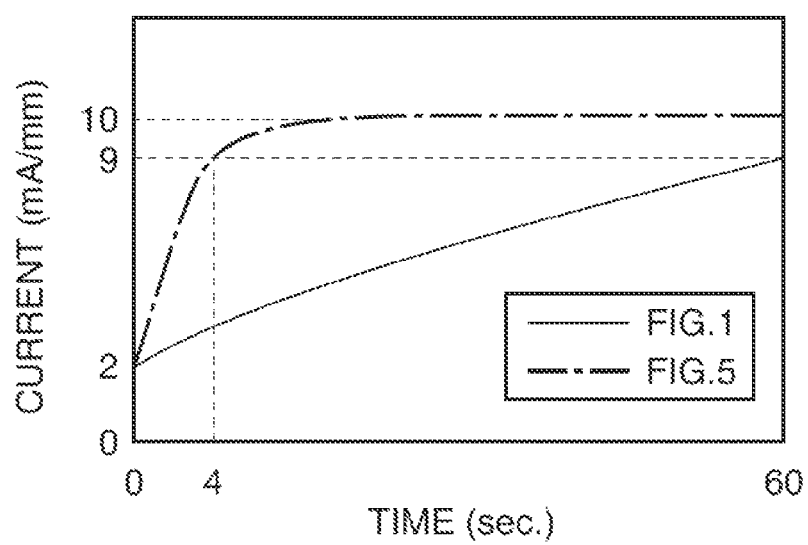
FIG. 6 is a graph illustrating drift phenomena of output of the GaN-based HEMT illustrated in FIG. 1 and the GaN-based HEMT illustrated in FIG. 5.
Figure 9A:
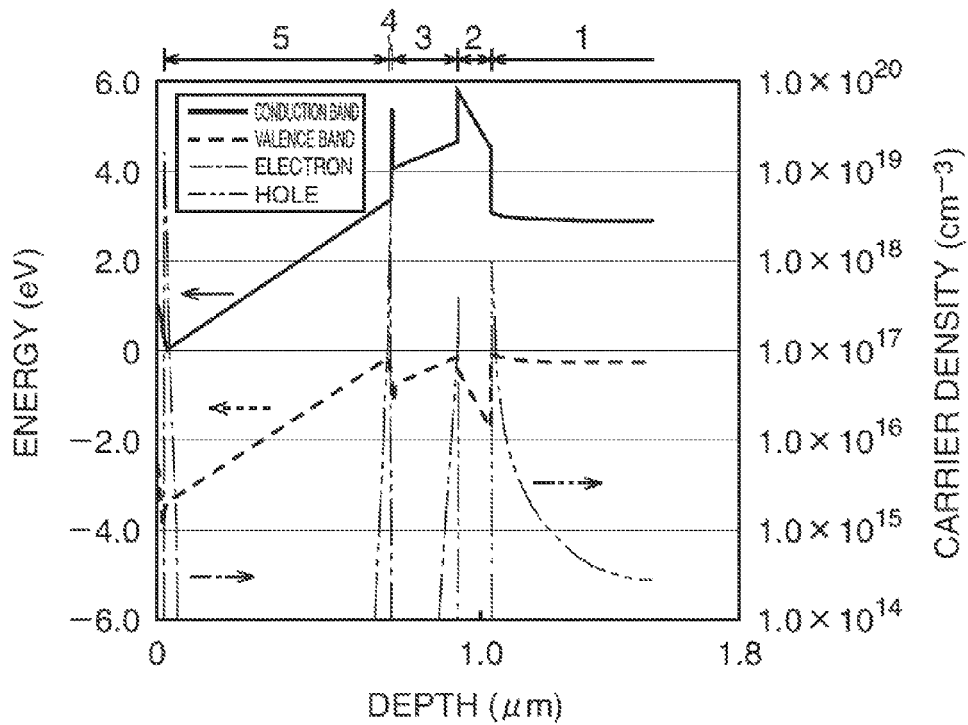
FIGS. 9A and 9B are charts illustrating a band structure and a carrier density in the first embodiment.
Figure 9B:
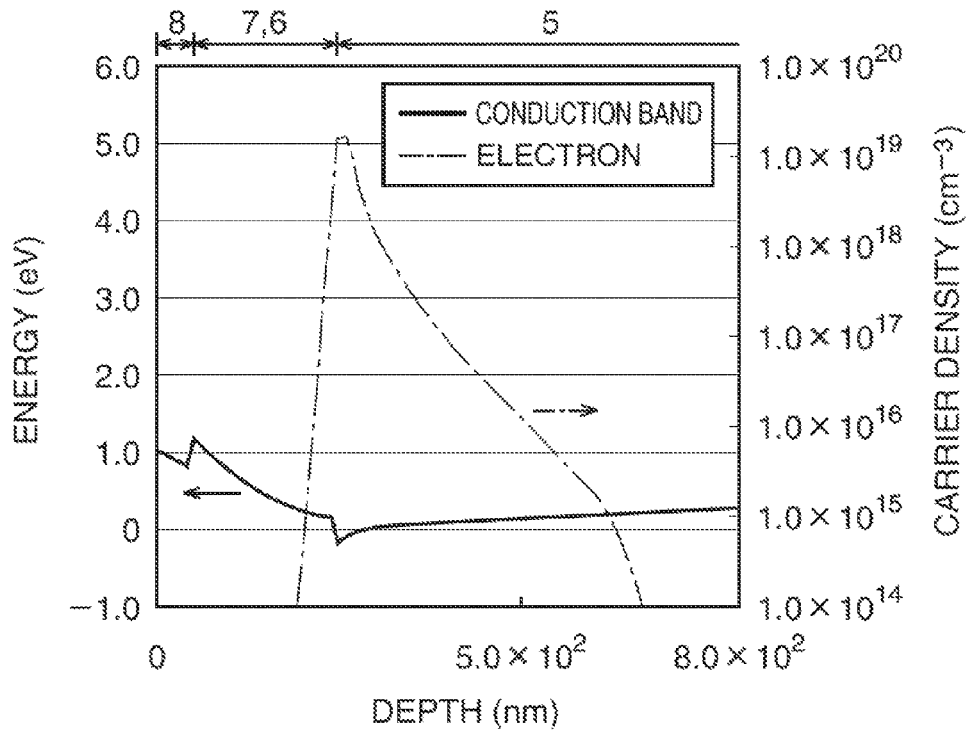
Figure 10A:
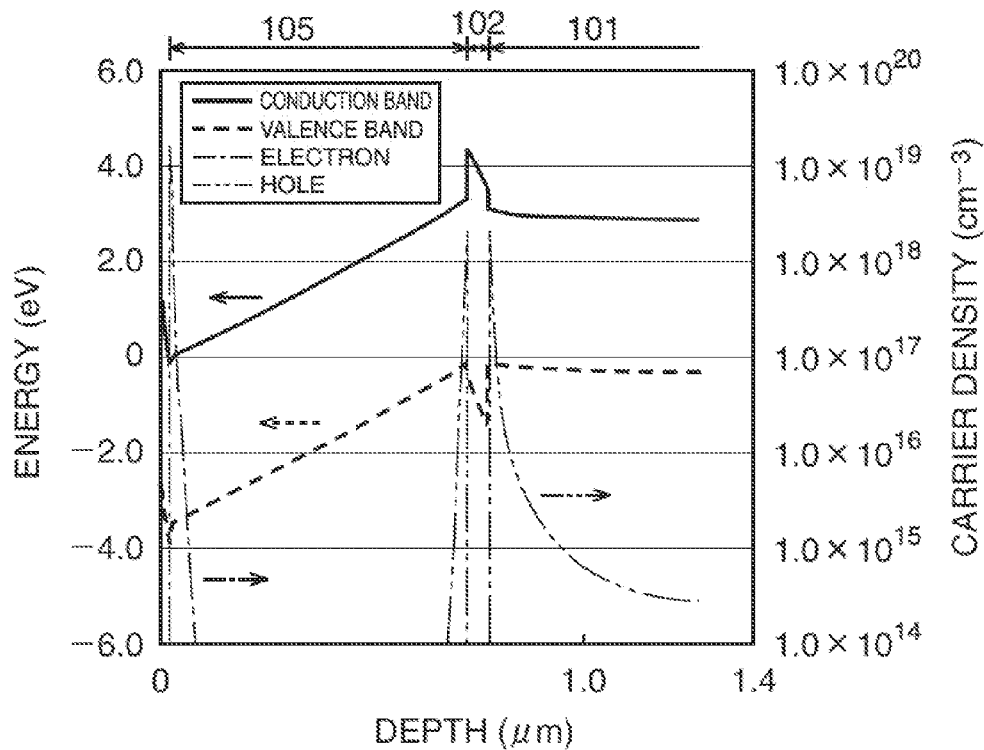
FIGS. 10A and 10B are charts illustrating a band structure and a carrier density in the conventional GaN-based HEMT illustrated in FIG. 1.
Figure 10B:
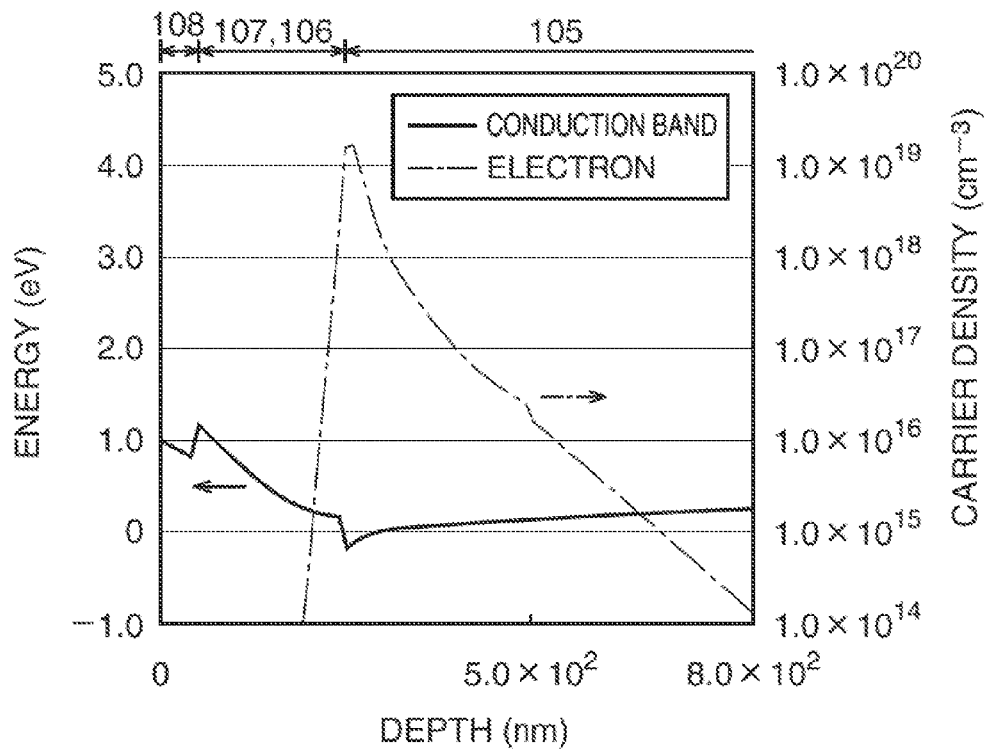

Now, the reason for that it becomes difficult for electrons to reach the trap existing in a lower portion of the i-GaN layer 5 will be described. FIGS. 9A and 9B are charts illustrating a band structure and a carrier density in the first embodiment. FIGS. 10A and 10B are charts illustrating a band structure and a carrier density in the conventional GaN-based HEMT illustrated in FIG. 1. Note that FIG. 9B illustrates a portion having an extremely shallow depth in FIG. 9A in enlargement, and FIG. 10B illustrates a portion having an extremely shallow depth in FIG. 10A in enlargement.

As can be seen from comparison of FIGS. 9A and 9B with FIGS. 10A and 10B, the conduction band of the substrate 1 and the conduction band of the substrate 101 are almost equal to each other. Further, conduction bands of the i-GaN layer 5, the i-AlGaN layer 6, the n-AlGaN layer 7, and the n-GaN layer 8 and conduction bands of the i-GaN layer 105, the i-AlGaN layer 106, the n-AlGaN layer 107, and the n-GaN layer 108 are almost equal to each other. However, in the first embodiment, the conduction band of the AlGaN layer 3 located directly above the AlN layer 2 is about 5.0 eV, whereas the conduction band of the i-GaN layer 105 located directly above the AlN layer 104 in the conventional GaN-based HEMT is about 3.5 eV. This is because piezoelectric charges and spontaneous polarization charges are strongly attracted to the vicinity of the interface between the AlGaN layers 3 and 4. Furthermore, in the first embodiment, the conduction band of the AlGaN layer 4 is high, and thus the AlGaN layer 4 functions as a barrier against movement of electrons toward the AlN layer 2.

Figure 11:
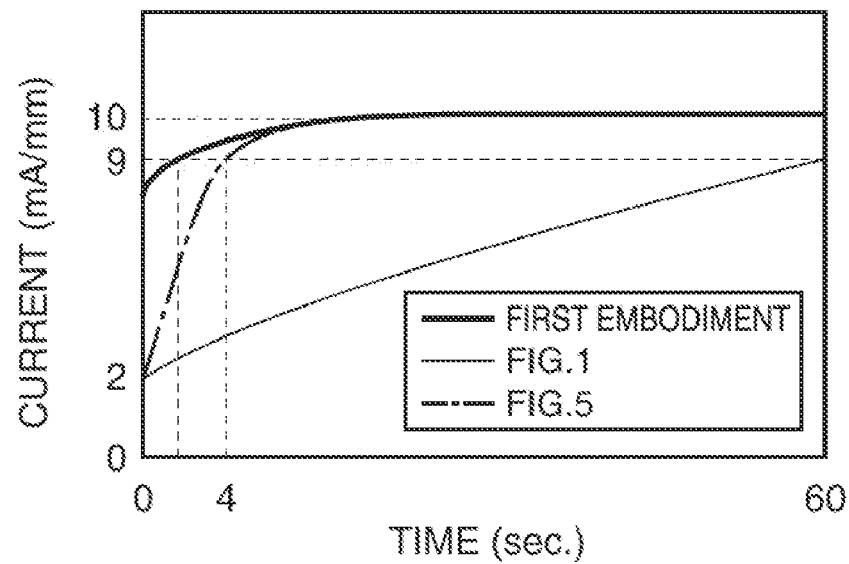
FIG. 11 is a graph illustrating drift phenomena of output of the GaN-based HEMT according to the first embodiment.

Due to these reasons, in the first embodiment, the density of electrons decreases rapidly in a region having a depth of about 600 nm to 700 nm, whereas in the conventional GaN-based HEMT, the density of electrons merely decreases gradually. This means that it is difficult for electrons to reach the trap existing in a lower portion of the i-GaN layer 5. Since it is difficult for electrons to reach the trap, the drift phenomenon of output accompanying the excessive response characteristic decreases. That is, as illustrated in FIG. 11, there is less drop of drain current when switched from on to off. Therefore, the dropped drain current recovers more quickly, and faster operations become possible.

Incidentally, it is preferred that the ratio x1 of Al in the AlGaN layer 3 be from 0.1 to 0.5. This is because when the ratio x1 is below 0.1, it may be difficult to sufficiently raise the conduction band of the AlGaN layer 4, and when the ratio x1 is above 0.5, deformation and warping can occur easily. Further, it is preferred that the ratio x2 of Al in the AlGaN layer 4 be equal to or higher than 0.3. This is because when the ratio x2 is below 0.3, it is difficult for the conduction band of the AlGaN layer 4 itself to be sufficiently high. It is preferred that the electron affinity of the AlN layer 2 be smaller than the electron affinity of the AlGaN layer 4. This is because when the electron affinity of the AlGaN layer 4 is equal to or smaller than the electron affinity of the AlN layer 2, the effect of suppressing movement of electrons decreases, which can easily cause insufficient suppression of the excessive response characteristic.

When the AlGaN layer 3 is not provided and the AlGaN layer 4 having a high ratio of Al is provided directly on the AlN layer 2, deformation and warping can easily occur similarly to the case where the ratio x1 of Al in the AlGaN layer 3 is above 0.5. Furthermore, the conduction band of the AlGaN layer 4 is not raised sufficiently, and it becomes difficult to sufficiently reduce the drain current. Therefore, the AlGaN layer 3, which has a relatively low ratio of Al, is needed.

It should be noted that resistors, capacitors, and the like may be further mounted to form a monolithic microwave integrated circuit (MMIC).

Next, a method of manufacturing the GaN-based HEMT (compound semiconductor device) according to the first embodiment will be described. FIG. 12A to FIG. 12E are cross-sectional views illustrating the method of manufacturing the GaN-based HEMT (compound semiconductor device) according to the first embodiment in order of steps.

Figure 12A:
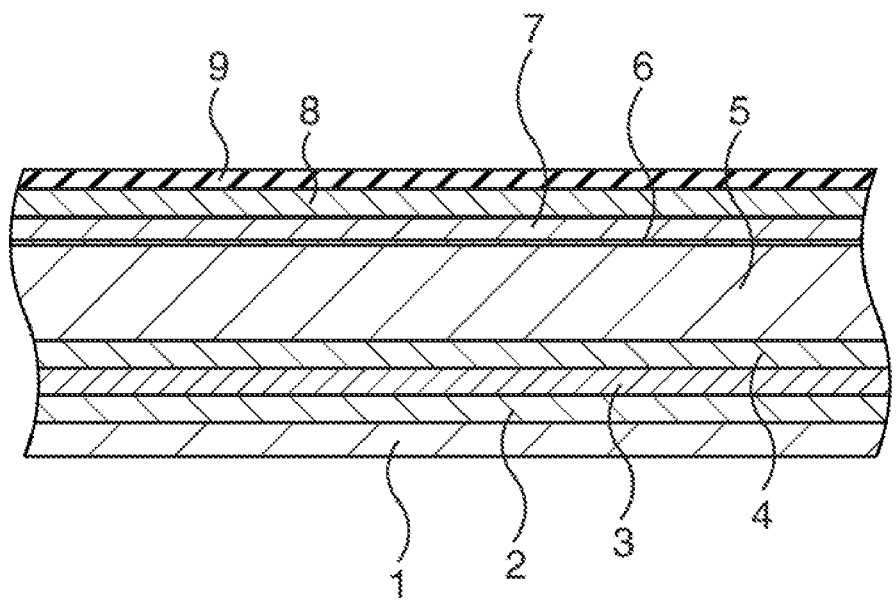
FIG. 12A to FIG. 12E are cross-sectional views illustrating a method of manufacturing the GaN-based HEMT according to the first embodiment in order of steps.

In the first embodiment, first, as illustrated in FIG. 12A, the AlN layer 2, the AlGaN layer 3, and the AlGaN layer 4 are formed in this order on the substrate 1, each as a buffer layer. Furthermore, the i-GaN layer 5 is formed on the AlGaN layer 4. Then, the i-AlGaN layer 6, the n-AlGaN layer 7, and the n-GaN layer 8 are formed in this order on the i-GaN layer 5. Formation of the AlN layer 2, the AlGaN layer 3, the AlGaN layer 4, the i-GaN layer 5, the i-AlGaN layer 6, the n-AlGaN layer 7, and the n-GaN layer 8 is performed by, for example, a crystal growth method such as a metal-organic vapor phase epitaxy (MOVPE) method. In this case, selecting raw material gases enables to form these layers sequentially. As a raw material for aluminum (Al), a raw material for gallium (Ga), and a raw material for indium (In), it is possible to use, for example, trimethylaluminum, trimethylgallium, and trimethylindium, respectively. As a raw material for nitrogen (N), for example, ammonia ($NH_3$) can be used. As a raw material for silicon (Si) included as impurity in the n-AlGaN layer 7 and the n-GaN layer 8, for example, silane ($SiH_4$) can be used.

Particularly, when forming the AlGaN layer 3, for example, there are introduced 20 sccm of trimethylaluminum, 30 sccm of trimethylgallium, 5 slm of ammonia, and 25 slm of hydrogen in an atmosphere at a growth temperature of 1000° C. and at a growth pressure of 90 Torr. In this case, an AlGaN layer 3 having a ratio x1 of Al of about 0.4 is obtained for example. When forming the AlGaN layer 4, for example, there are introduced 30 sccm of trimethylaluminum, 20 sccm of trimethylgallium, 5 slm of ammonia, and 25 slm of hydrogen in an atmosphere at a growth temperature of 1000° C. and at a growth pressure of 90 Torr. In this case, an AlGaN layer 4 having a ratio x2 of Al of about 0.8 is obtained for example.

After the n-GaN layer 8 is formed, the SiN layer 9 is formed thereon by a plasma CVD (chemical vapor deposition) method for example.

Figure 12B:
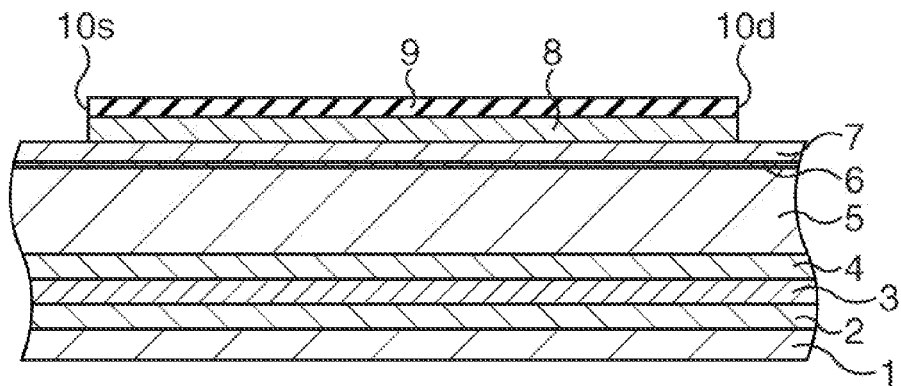

Next, on the SiN layer 9, there is formed a resist pattern to open areas intended for forming the source electrode 11s and the drain electrode 11d. Thereafter, using the resist pattern as a mask, the SiN layer 9 and the n-GaN layer 8 are etched to form the opening 10s for source electrode and the opening 10d for drain electrode, as illustrated in FIG. 12B, in the SiN layer 9 and the n-GaN layer 8. As this etching, for example, dry etching using a chlorine-based gas is performed. Incidentally, with respect to depths of the openings 10s and 10d, a portion of the n-GaN layer 8 may be left, and a portion of the n-AlGaN layer 7 may be removed. That is, it is not necessary for the depths of the openings 10s and 10d to match the total thickness of the SiN layer 9 and the n-GaN layer 8.

Figure 12C:
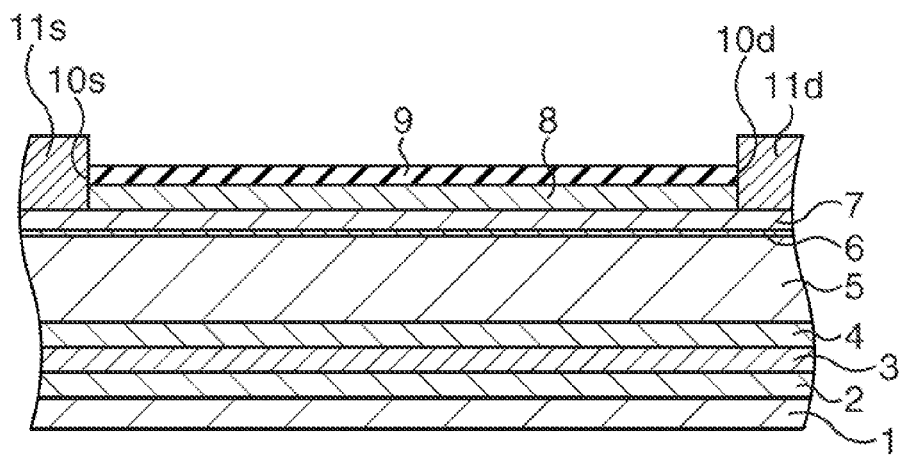

Subsequently, as illustrated in FIG. 12C, the source electrode 11s and the drain electrode 11d are formed in the openings 10s and 10d, respectively, by a lift-off method. In formation of the source electrode 11s and the drain electrode 11d, after the resist pattern used for forming the openings 10s and 10d is removed, there is formed a new resist pattern to open areas for forming the source electrode 11s and the drain electrode 11d, and vapor deposition of Ta and Al is performed. Thereafter, Ta and Al deposited on the resist pattern are removed together with the resist pattern. Thicknesses of the Ta film and the Al film are, for example, about 30 nm and about 200 nm, respectively. Then heat treatment is performed in a nitrogen atmosphere at a temperature of 400° C. to 1000° C., for example 600° C., to thereby establish an ohmic characteristic.

Figure 12D:
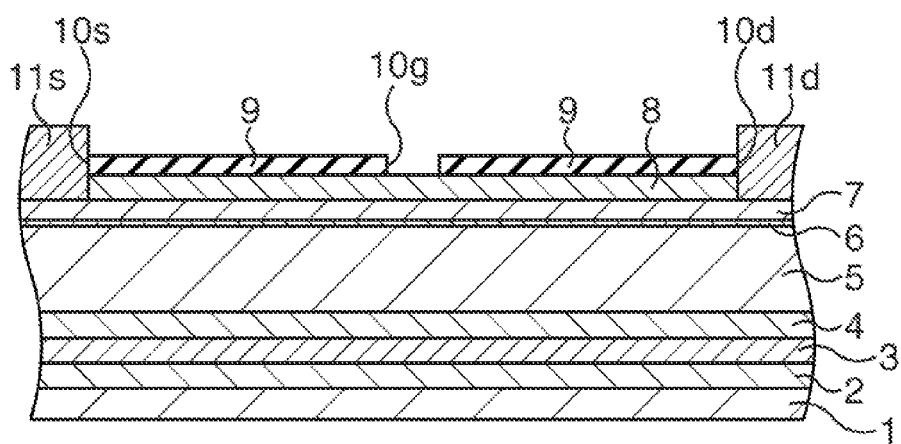

After the source electrode 11s and the drain electrode 11d are formed, there is formed a resist pattern to open an area intended for forming the opening 10g. Then etching using the resist pattern is performed to form the opening 10g in the SiN layer 9, as illustrated in FIG. 12D. As this etching, for example, wet etching using acid is performed. The resist pattern is then removed. By such etching, the n-GaN layer 8 is not etched, and thus even etching within the wafer surface is possible.

Figure 12E:
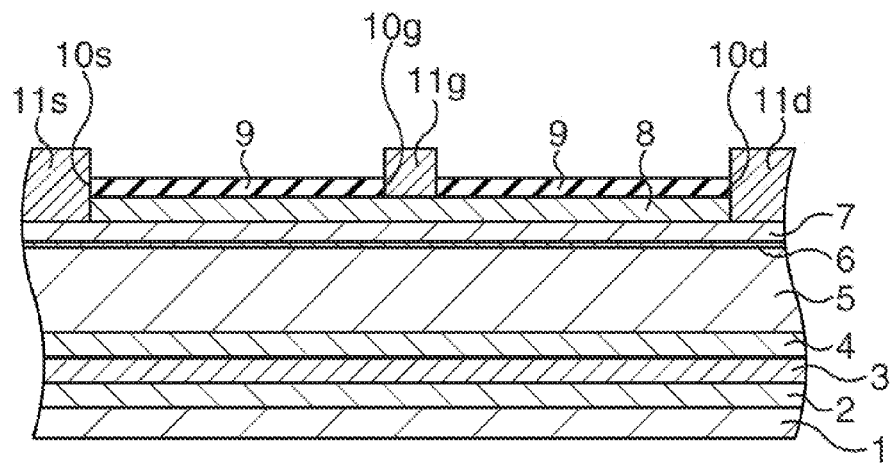

Thereafter, as illustrated in FIG. 12E, the gate electrode 11g is formed in the opening 10g by a lift-off method. In formation of the gate electrode 11g, after the resist pattern used for forming the opening 10g is removed, there is formed a new resist pattern to open an area for forming the gate electrode 11g, and vapor deposition of Ni and Au is performed. Thereafter, Ni and Au deposited on the resist pattern are removed together with the resist pattern. Thicknesses of the Ni film and the Au film are, for example, about 30 nm and about 400 nm, respectively.

By such a manufacturing method, the GaN-based HEMT having the structure illustrated in FIG. 7 can be obtained.

Incidentally, a gate length of the gate electrode 11g, that is, a length in the direction connecting the source electrode 11s and the drain electrode 11d is about 0.05 µm to 2 µm (0.5 µm for example). Further, a unit gate width, that is, a length in the direction orthogonal to the direction of the gate length is about 50 µm to 800 µm (400 µm for example).

Second Embodiment

Figure 13:
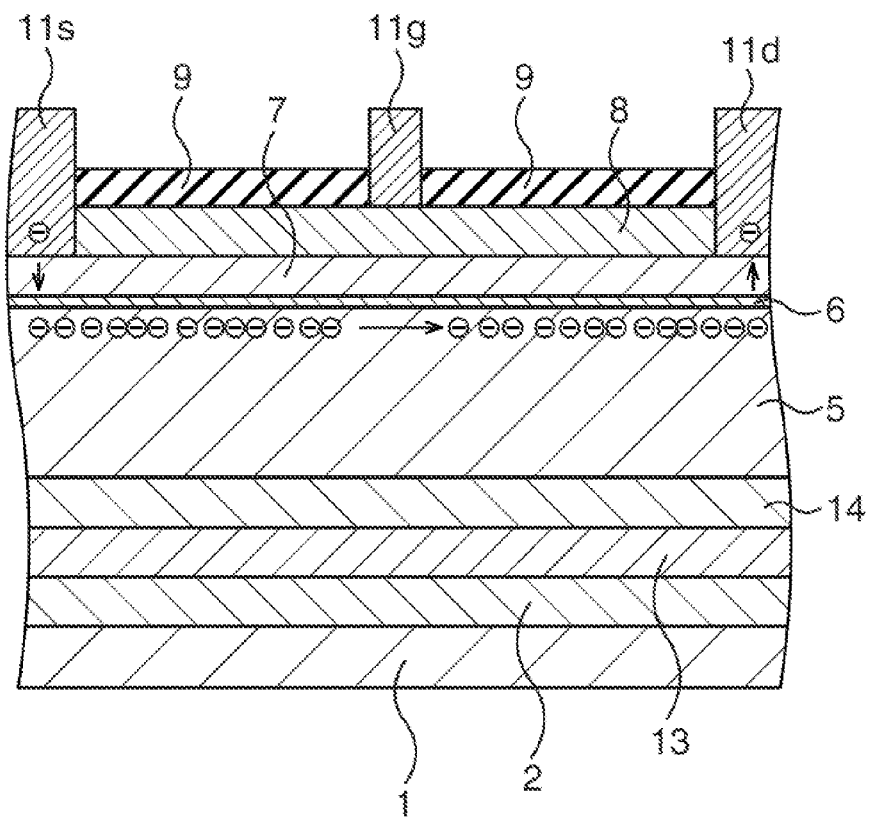
FIG. 13 is a cross-sectional view illustrating a structure of a GaN-based HEMT (compound semiconductor device) according to a second embodiment.

Next, a second embodiment will be described. FIG. 13 is a cross-sectional view illustrating a structure of a GaN-based HEMT (compound semiconductor device) according to the second embodiment.

In the second embodiment, a non-doped InAlN layer 13 having a thickness of about 10 nm to 500 nm (300 nm for example) is provided instead of the AlGaN layer 3 in the first embodiment, and an InAlN layer 14 having a thickness of about 5 nm to 500 nm (100 nm for example) is provided instead of the AlGaN layer 4. The InAlN layer 13 has a composition represented by $In_{y1}Al_{1-y1}N$, and the InAlN layer 14 has a composition represented by $In_{y2}Al_{1-y2}N$. The electron affinity of the InAlN layer 13 is higher than electron affinities of the AlN layer 2 and the InAlN layer 14, and the electron affinity of the AlN layer 2 is smaller than the electron affinity of the InAlN layer 14. The value of y1 is larger than the value of y2. The value of y1 is about 0.1 to 0.25 (0.23 for example), and the value of y2 is about 0.1 to 0.25 (0.15 for example).

The other structure is similar to that in the first embodiment.

Figure 14A:
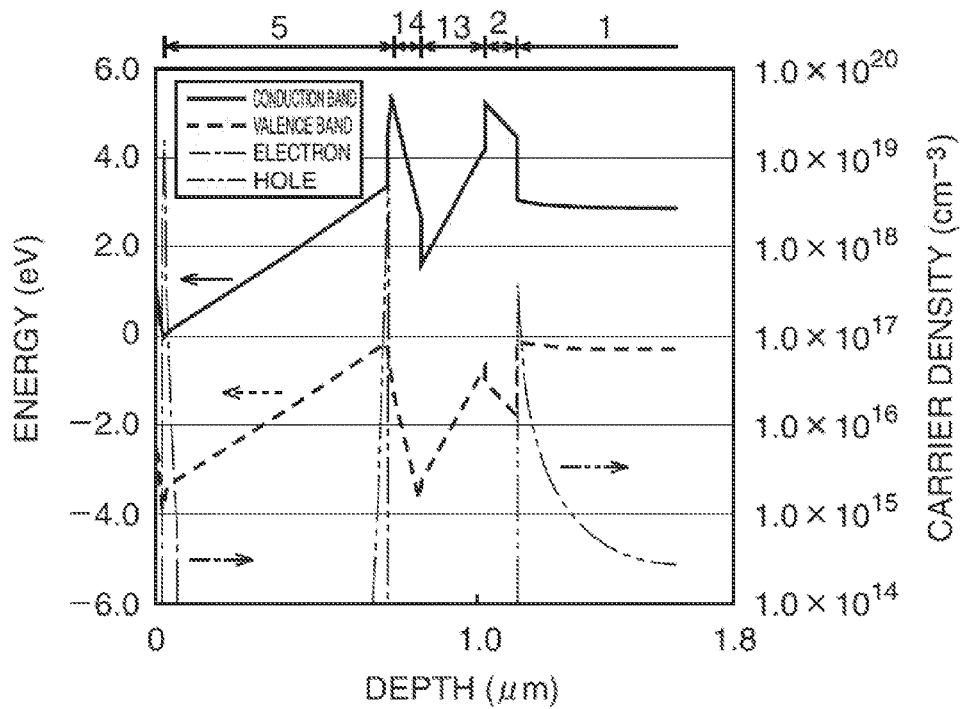
FIGS. 14A and 14B are charts illustrating a band structure and a carrier density in the second embodiment.
Figure 14B:
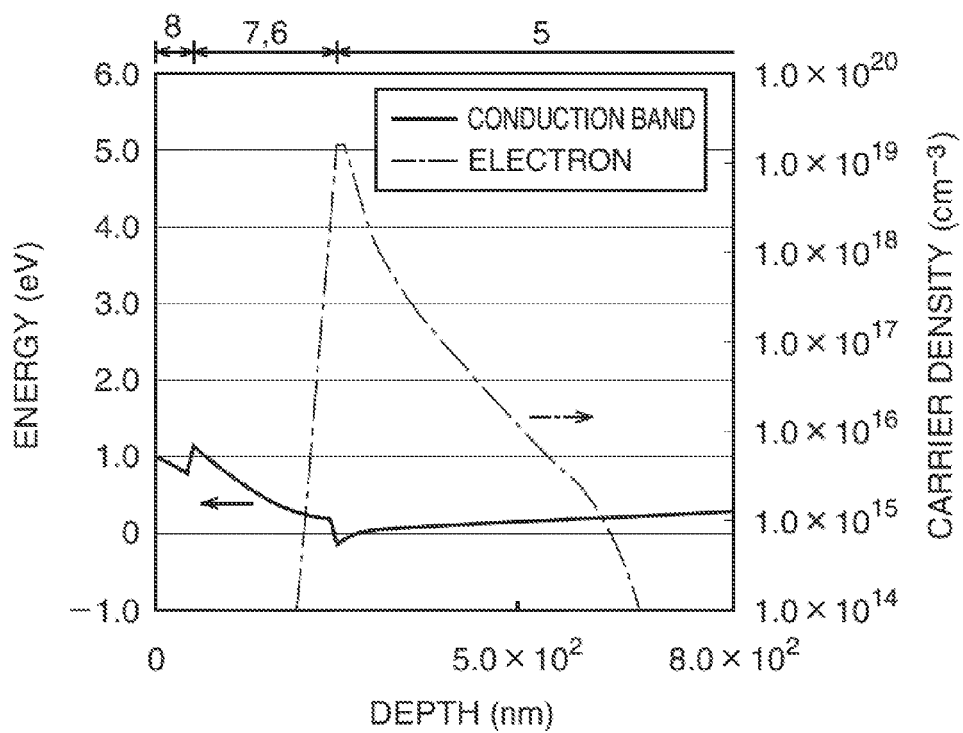

In the second embodiment as described above, similar effects to those in the first embodiment can be obtained. FIGS. 14A and 14B are charts illustrating a band structure and a carrier density in the second embodiment. Note that FIG. 14B illustrates a portion having an extremely shallow depth in FIG. 14A in enlargement.

Figure 15:
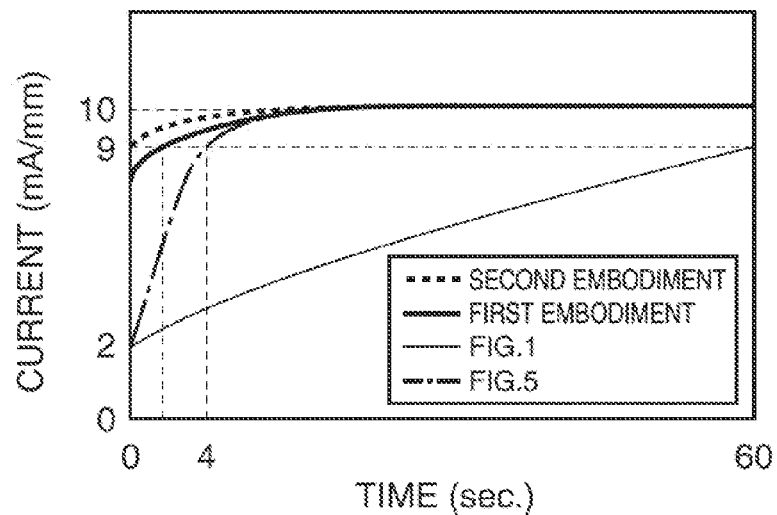
FIG. 15 is a graph illustrating drift phenomena of output of the GaN-based HEMT according to the second embodiment.

In the second embodiment, the conduction band of the InAlN layer 13 located directly above the AlN layer 2 is higher than 4.0 eV. Accordingly, also in the second embodiment, the density of electrons steeply drops in a region having a depth of about 600 nm to 700 nm. Therefore, similarly to the first embodiment, the drift phenomenon of output accompanying the excessive response characteristic is reduced. That is, as illustrated in FIG. 15, there is less drop of the drain current when switched from on to off. Therefore, the dropped drain current recovers more quickly, and faster operations become possible.

Figure 16:
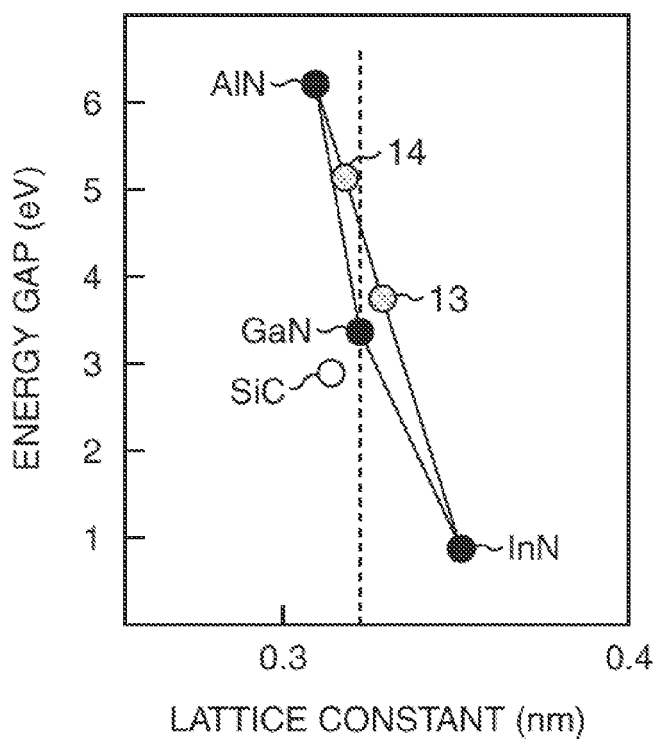
FIG. 16 is a chart illustrating a relationship between a lattice constant and an energy gap.

As illustrated in FIG. 16, the lattice constant of AlGaN used in the buffer layers in the first embodiment is smaller than the lattice constant of GaN, but the lattice constant of InAlN used in the buffer layers in the second embodiment may be larger than the lattice constant of GaN depending on the ratios of In and Al. For example, when the ratio y1 of In in the InAlN layer 13 is 0.23, the lattice constant thereof becomes larger than that of GaN. When the ratio y2 of In in the InAlN layer 14 is 0.15, the lattice constant thereof becomes smaller than that of GaN. Therefore, distortion does not easily occur even when the difference in lattice constant between the InAlN layers 13 and 14 is increased. Accordingly, the InAlN layer 14 can be made thicker than the AlGaN layer 4 to raise the conduction band further, so as to make it more difficult for electrons to reach the trap. Moreover, the difference in lattice constant between In and Al is larger than the difference in lattice constant between Al and Ga. Thus, spontaneous polarization is induced more strongly, and also in this aspect, it is possible to make it more difficult for electrons to reach the trap.

Incidentally, it is preferred that the ratios y1 and y2 of In in the InAlN layer 13 and the InAlN layer 14 be from 0.1 to 0.25. This is because when the ratios y1 and y2 are below 0.1, it may be difficult to sufficiently raise the conduction band of the InAlN layer 14, and an InAlN layer having the ratios y1 and y2 higher than 0.25 is difficult to form.

When manufacturing the GaN-based HEMT according to the second embodiment, the InAlN layers 13 and 14 may be formed instead of the AlGaN layers 3 and 4 in the first embodiment. Trimethylindium is used as an In raw material. The growth temperature is set to 950° C., which is lower than that for AlGaN. This is for suppressing desorption of In. For example, when forming the InAlN layer 13, there are introduced 150 sccm of trimethylindium, 30 sccm of trimethylgallium, 5 slm of ammonia, and 25 slm of hydrogen for example in an atmosphere at a growth temperature of 950° C. and at a growth pressure of 90 Torr. In this case, for example, the InAlN layer 13 having a ratio of In of about 0.23 is obtained. When the InAlN layer 14 is formed, for example, there are introduced 100 sccm of trimethylindium, 20 sccm of trimethylgallium, 5 slm of ammonia, and 25 slm of hydrogen in an atmosphere at a growth temperature of 950° C. and at a growth pressure of 90 Torr. In this case, for example, the InAlN layer 14 having a ratio of In of about 0.15 is obtained.

Note that in either embodiment, a silicon carbide (SiC) substrate, a sapphire substrate, a silicon substrate, a GaN substrate, a GaAs substrate, or the like may be used as the substrate 1. The substrate 1 may be any of a conductive substrate, a semi-conductive substrate and an insulating substrate.

The structures of the gate electrode 11g, the source electrode 11s, and the drain electrode 11d are not limited to those in the above-described embodiments. For example, they may be formed of a single layer. The method of forming them is not limited to the lift-off method. Further, as long as the ohmic characteristic is obtained, the heat treatment after forming the source electrode 11s and the drain electrode 11d may be omitted. In addition, heat treatment may be performed for the gate electrode 11g.

Thicknesses, materials, and so on of the layers are not limited to those in the above-described embodiments. For example, InAlGaN or the like may be used for the buffer layers. Further, the AlGaN layer 3 in the first embodiment and the InAlN layer 14 in the second embodiment may be combined.

In the first and second embodiments, the portion of the n-GaN layer 8 with which the gate electrode 11g is in contact may be etched. The depth of the etching may match the thickness of the n-GaN layer 8, or may be shallower. However, it is preferred that this etching be performed evenly.

In the first and second embodiments, a fourth buffer layer may be formed on the third buffer layer. In this case, it is preferred that the electron affinity of the fourth buffer layer be larger than the electron affinity of the third buffer layer. When such a fourth buffer is provided, the crystallinity of the channel layer improves further. As the fourth buffer layer in the first embodiment, for example, one similar to the second buffer layer can be used. That is, in the first embodiment, for example an AlGaN layer having a composition similar to that of the AlGaN layer 3 can be used, and in the second embodiment, for example, an InAlN layer having a composition similar to that of the InAlN layer 13 can be used.

The above-described compound semiconductor device and so on enables to further suppress a drift phenomenon of output accompanying excessive response characteristic by appropriate first to third buffer layers.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention(s) has(have) been described in detail, it should be understood that various changes, substitutions, and alterations could be made hereto without departing from the spirit and scope of the invention.

What is claimed is:

1. A compound semiconductor device, comprising:
a substrate;
a first buffer layer formed over the substrate;
a second buffer layer formed over the first buffer layer and larger in electron affinity than the first buffer layer;
a third buffer layer formed over the second buffer layer and smaller in electron affinity than the second buffer layer;
a channel layer formed over the third buffer layer; and
an electron supply layer formed over the channel layer, wherein the first buffer layer, the second buffer layer and the third buffer layer are GaN-based layers.

2. A compound semiconductor device comprising:
a substrate;
a first buffer layer formed over the substrate;
a second buffer layer formed over the first buffer layer and larger in electron affinity than the first buffer layer;
a third buffer layer formed over the second buffer layer and smaller in electron affinity than the second buffer layer;
a channel layer formed over the third buffer layer; and
an electron supply layer formed over the channel layer, wherein the electron affinity of the first buffer layer is smaller than the electron affinity of the third buffer layer.

3. The compound semiconductor device according to claim 1, wherein the first buffer layer, the second buffer layer, and the third buffer layer are formed of nitride semiconductor.

4. The compound semiconductor device according to claim 1, wherein the first buffer layer, the second buffer layer, and the third buffer layer contain at least aluminum.

5. A compound semiconductor device comprising:
a substrate;
a first buffer layer formed over the substrate;
a second buffer layer formed over the first buffer layer and larger in electron affinity than the first buffer layer;
a third buffer layer formed over the second buffer layer and smaller in electron affinity than the second buffer layer;
a channel layer formed over the third buffer layer; and
an electron supply layer formed over the channel layer, wherein
the second buffer layer has a composition represented by $Al_{x1}Ga_{1-x1}N$ $(0.1 \leq x1 \leq 0.5)$;
the third buffer layer has a composition represented by $Al_{x2}Ga_{1-x2}N$ $(0.3 \leq x2 \leq 1)$; and
a value of x1 is smaller than a value of x2.

6. A compound semiconductor device comprising:
a substrate;
a first buffer layer formed over the substrate;
a second buffer layer formed over the first buffer layer and larger in electron affinity than the first buffer layer;
a third buffer layer formed over the second buffer layer and smaller in electron affinity than the second buffer layer;
a channel layer formed over the third buffer layer; and
an electron supply layer formed over the channel layer, wherein
the second buffer layer has a composition represented by $In_{y1}Al_{1-y1}N$ $(0.1 \leq y1 \leq 0.25)$;
the third buffer layer has a composition represented by $In_{y2}Al_{1-y2}N$ $(0.1 \leq y2 \leq 0.25)$; and
a value of y1 is larger than a value of y2.

7. The compound semiconductor device according to claim 6, wherein
a lattice constant of the second buffer layer is larger than a lattice constant of gallium nitride; and
a lattice constant of the third buffer layer is smaller than the lattice constant of gallium nitride.

8. A compound semiconductor device comprising:
a substrate;
a first buffer layer formed over the substrate;
a second buffer layer formed over the first buffer layer and larger in electron affinity than the first buffer layer;
a third buffer layer formed over the second buffer layer and smaller in electron affinity than the second buffer layer;
a channel layer formed over the third buffer layer; and
an electron supply layer formed over the channel layer, wherein
the second buffer layer has a composition represented by $In_{y1}Al_{1-y1}N$ ($0.1 \leq y1 \leq 0.25$); and
the third buffer layer has a composition represented by $Al_{x2}Ga_{1-x2}N$ ($0.3 \leq x2 \leq 1$).

9. A compound semiconductor device comprising:
a substrate;
a first buffer layer formed over the substrate;
a second buffer layer formed over the first buffer layer and larger in electron affinity than the first buffer layer;
a third buffer layer formed over the second buffer layer and smaller in electron affinity than the second buffer layer;
a channel layer formed over the third buffer layer; and
an electron supply layer formed over the channel layer,
wherein the first buffer layer has a composition represented by AlN.

10. The compound semiconductor device according to claim 1, further comprising a fourth buffer layer arranged between the third buffer layer and the channel layer and larger in electron affinity than the third buffer layer.

11. A compound semiconductor device, comprising:
a substrate,
a first buffer layer formed over the substrate and containing aluminum;
a second buffer layer formed over the first buffer layer and containing a lower concentration of aluminum than that in the first buffer layer;
a third buffer layer formed over the second buffer layer and containing a higher concentration of aluminum than that in the second buffer layer;
a channel layer formed over the third buffer layer; and
an electron supply layer formed over the channel layer.

12. The compound semiconductor device according to claim 11, further comprising a fourth buffer layer arranged between the third buffer layer and the channel layer and larger in electron affinity than the third buffer layer.

* * * * *